United States Patent
Liu et al.

(10) Patent No.: US 11,953,372 B2
(45) Date of Patent: Apr. 9, 2024

(54) OPTICAL SENSING DEVICE

(71) Applicant: InnoLux Corporation, Miao-Li County (TW)

(72) Inventors: Yu-Tsung Liu, Miao-Li County (TW); Wei-Ju Liao, Miao-Li County (TW); Wei-Lin Wan, Miao-Li County (TW); Cheng-Hsueh Hsieh, Miao-Li County (TW); Po-Hsin Lin, Miao-Li County (TW); Te-Yu Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/577,388

(22) Filed: Jan. 18, 2022

(65) Prior Publication Data
US 2022/0260417 A1  Aug. 18, 2022

Related U.S. Application Data

(60) Provisional application No. 63/150,584, filed on Feb. 18, 2021.

(30) Foreign Application Priority Data

Sep. 30, 2021 (CN) .......................... 202111156609.4

(51) Int. Cl.
*G01J 1/04* (2006.01)
*G01J 1/44* (2006.01)
(Continued)

(52) U.S. Cl.
CPC ............... *G01J 1/44* (2013.01); *G01J 1/0411* (2013.01); *G01J 1/0437* (2013.01);
(Continued)

(58) Field of Classification Search
CPC .......... G01J 1/44; G01J 1/0411; G01J 1/0437; G01J 2001/446; G01J 2001/4473;
(Continued)

(56) References Cited

U.S. PATENT DOCUMENTS 5,514,888 A * 5/1996 Sano ................. H01L 27/14623
438/69
7,030,918 B1 * 4/2006 Nakashiba ........ H01L 27/14621
348/294

(Continued)

FOREIGN PATENT DOCUMENTS

| CN | 108629252 A | 10/2018 |
| CN | 110164307 A | 8/2019 |

(Continued)

*Primary Examiner* — Thanh Luu
(74) *Attorney, Agent, or Firm* — Winston Hsu

(57) ABSTRACT

An optical sensing device is disclosed. The optical sensing device includes a sensing pixel, a driving circuit and a first light shielding layer. The sensing pixel includes a sensing circuit and a sensing element electrically connected to the sensing circuit. The driving circuit is electrically connected to the sensing circuit. The first light shielding layer includes at least one first opening corresponding to the sensing element, and the first light shielding layer is overlapped with the driving circuit in a top-view direction of the optical sensing device.

18 Claims, 8 Drawing Sheets

(51) Int. Cl.
*H01L 27/146* (2006.01)
*G06V 40/13* (2022.01)

(52) U.S. Cl.
CPC .. *H01L 27/14623* (2013.01); *H01L 27/14627* (2013.01); *G01J 2001/446* (2013.01); *G01J 2001/4473* (2013.01); *G06V 40/1318* (2022.01)

(58) Field of Classification Search
CPC ......... H01L 27/14623; H01L 27/14627; H01L 27/14605; H01L 27/1463; H01L 27/14643; G06V 40/1318
See application file for complete search history.

(56) References Cited

U.S. PATENT DOCUMENTS

| | | | |
|---|---|---|---|
| 2005/0067640 A1* | 3/2005 | Ohkawa | H01L 27/14632 |
| | | | 257/E27.131 |
| 2012/0062777 A1 | 3/2012 | Kobayashi | |
| 2015/0109501 A1* | 4/2015 | Sekine | H01L 27/14627 |
| | | | 438/69 |
| 2018/0158858 A1* | 6/2018 | Moriya | H01L 27/14623 |
| 2018/0270403 A1 | 9/2018 | Chung | |
| 2019/0267421 A1* | 8/2019 | Suzuki | H01L 27/14623 |
| 2020/0194475 A1 | 6/2020 | Kim | |
| 2021/0313369 A1* | 10/2021 | Tange | H01L 27/1464 |
| 2022/0293657 A1* | 9/2022 | Chou | G06V 40/1324 |

FOREIGN PATENT DOCUMENTS

| | | |
|---|---|---|
| CN | 111381725 A | 7/2020 |
| WO | 2018/139278 A1 | 8/2018 |

* cited by examiner

OPTICAL SENSING DEVICE

CROSS REFERENCE TO RELATED APPLICATION

This patent application claims the benefit of U.S. provisional application No. 63/150,584, filed Feb. 18, 2021, and the entire contents of which are incorporated herein by reference.

BACKGROUND OF THE DISCLOSURE

1. Field of the Disclosure

The present disclosure relates to an optical sensing device, and more particularly to an optical sensing device including a light shielding layer.

2. Description of the Prior Art

In recent years, the technology of integrating optical sensors into electronic products develops flourishingly. For example, the optical sensors may be cooperated with collimator-like structures and applied in display devices such as smart phones or tablet computers for fingerprint recognition. However, according to the design of the conventional light collimating structure, stray light or ambient light may affect the operation of the optical sensors, resulting in poor signal-to-noise ratio.

SUMMARY OF THE DISCLOSURE

One of the objectives of the present disclosure is to provide an optical sensing device to solve the problems encountered by the conventional optical sensing device. Through the design of the light shielding layer, the influence of stray light or ambient light can be reduced, thereby improving the signal-to-noise ratio of optical signals. Based on the design of the present disclosure, the complexity of the manufacturing process may be reduced, or the adhesion between layers may be improved.

An embodiment of the present disclosure provides an optical sensing device. The optical sensing device includes a sensing pixel, a driving circuit and a first light shielding layer. The sensing pixel includes a sensing circuit and a sensing element electrically connected to the sensing circuit. The driving circuit is electrically connected to the sensing circuit. The first light shielding layer includes at least one first opening corresponding to the sensing element, and the first light shielding layer is overlapped with the driving circuit in a top-view direction of the optical sensing device.

These and other objectives of the present disclosure will no doubt become obvious to those of ordinary skill in the art after reading the following detailed description of the embodiment that is illustrated in the various figures and drawings.

DETAILED DESCRIPTION

Figure 1:
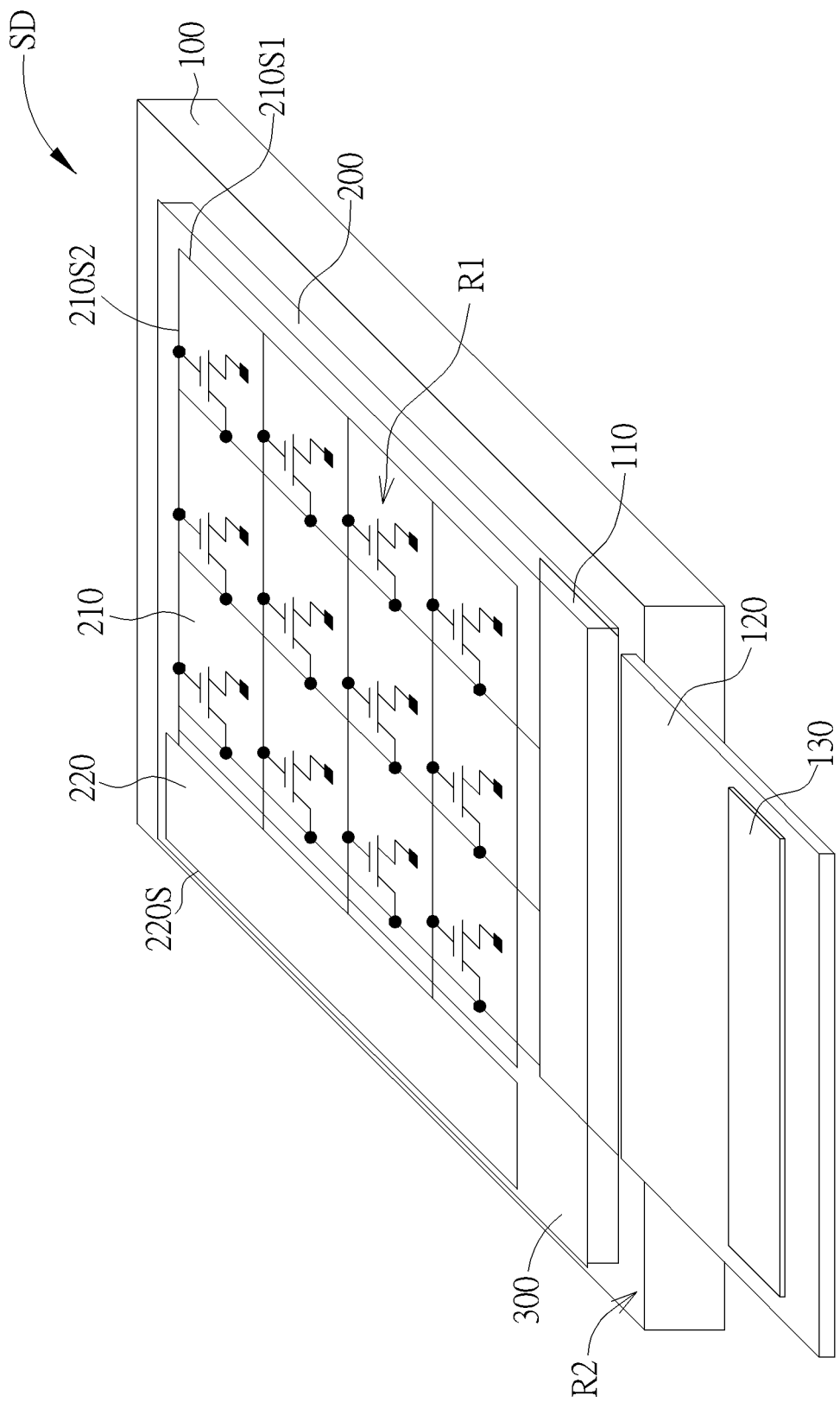
FIG. 1 is an architecture schematic diagram of an optical sensing device according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device or the structure, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations and/or components.

When a component or layer is referred to as being "on" or "connected to" another component or layer, it may be directly on or directly connected to the other component or layer, or intervening components or layers may be presented (indirect condition). In contrast, when a component or layer is referred to as being "directly on" or "directly connected to" another component or layer, there are no intervening components or layers presented.

The directional terms mentioned in this document, such as "up", "down", "front", "back", "left", "right", etc., are only directions referring to the drawings. Therefore, the directional terms used are for illustration, not for limitation of the present disclosure. In the drawings, each drawing shows the general characteristics of structures and/or materials used in specific embodiments. However, these drawings should not be interpreted as defining or limiting the scope or nature covered by these embodiments. For example, the relative size, thickness and position of each layer, region and/or structure may be reduced or enlarged for clarity.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

It should be noted that the technical features in different embodiments described in the following can be replaced, recombined, or mixed with one another to constitute another embodiment without departing from the spirit of the present disclosure.

Figure 2:
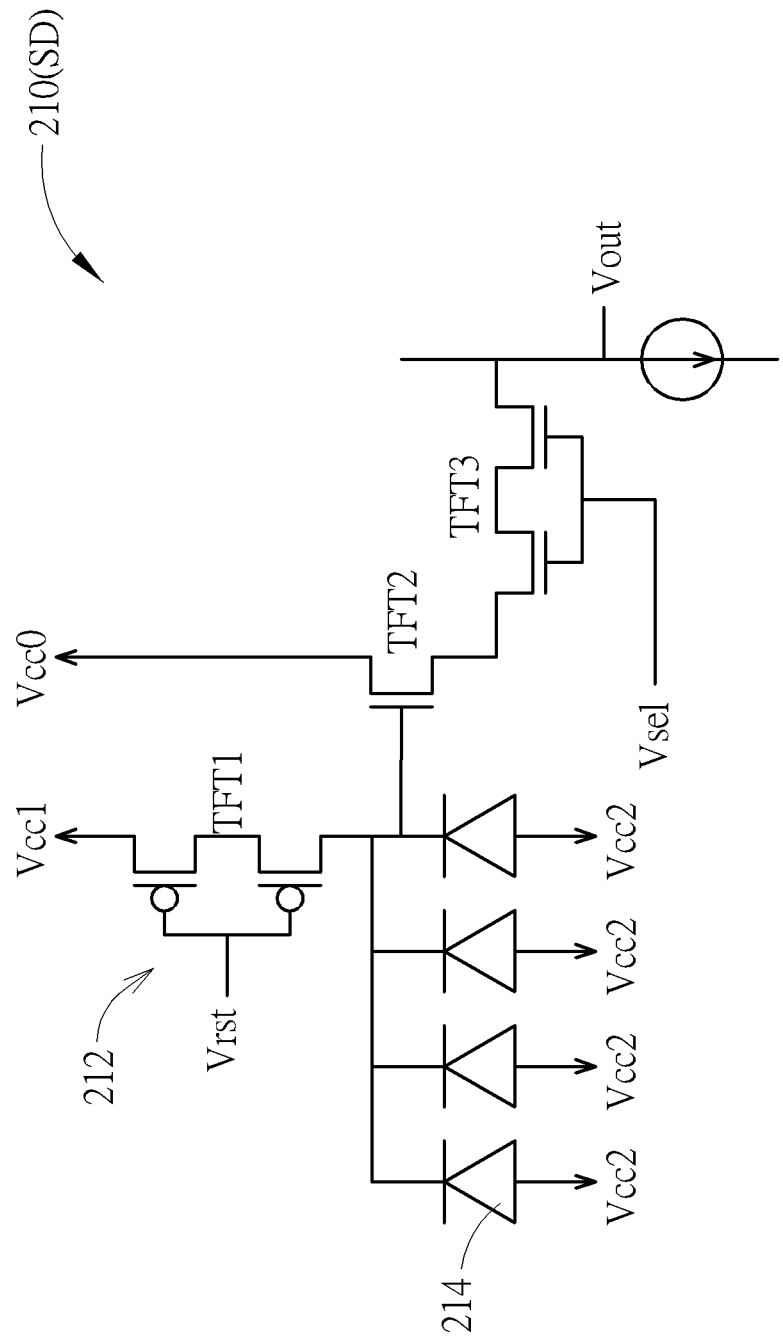
FIG. 2 is a circuit architecture schematic diagram of a sensing pixel of an optical sensing device according to an embodiment of the present disclosure.
Figure 3:
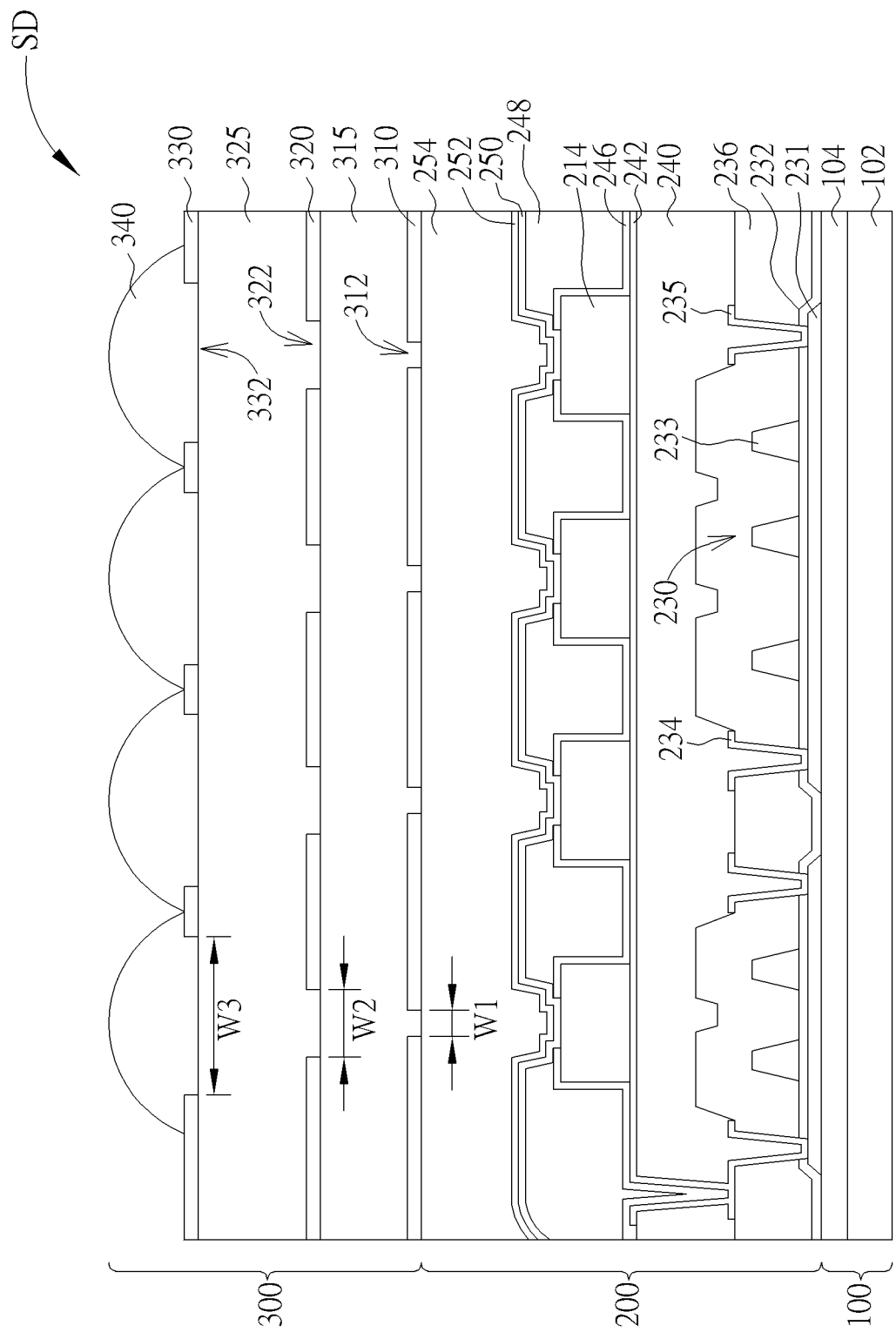
FIG. 3 is a partial cross-sectional view schematic diagram of an optical sensing device according to a first embodiment of the present disclosure.

Please refer to FIG. 1, FIG. 2 and FIG. 3. FIG. 1 is an architecture schematic diagram of an optical sensing device according to an embodiment of the present disclosure. FIG. 2 is a circuit architecture schematic diagram of a sensing pixel of an optical sensing device according to an embodiment of the present disclosure. FIG. 3 is a partial cross-sectional view schematic diagram of an optical sensing device according to a first embodiment of the present disclosure. As shown in FIG. 1, FIG. 2 and FIG. 3, an optical sensing device SD according to an embodiment of the present disclosure has a sensing region R1 and a peripheral region R2, and the peripheral region R2 is adjacent to the sensing region R1. For example, the peripheral region R2 may be located around or surround the sensing region R1, but not limited herein. The optical sensing device SD may include a sensing pixel 210 and a driving circuit 220, the sensing pixel 210 may be disposed in the sensing region R1, and the driving circuit 220 may be disposed in the peripheral region R2. The optical sensing device SD may include a plurality of sensing pixels 210, and the plurality of sensing pixels 210 may be, for example, disposed in the sensing region R1 as an array manner, but not limited herein. In some embodiments, as shown in FIG. 1, a multiplexer (MUX) 110 may be disposed in the peripheral region R2. At least a portion of a circuit board 120 may be disposed in the peripheral region R2, and a signal reading element 130 may be disposed on the circuit board 120. For example, the driving circuit 220 may be disposed in the peripheral region R2 located at a side (e.g., the left side or the right side) of the sensing region R1, and the multiplexer 110 and the at least a portion of the circuit board 120 may be disposed in the peripheral region R2 located at another side (e.g., the lower side) of the sensing region R1, but not limited herein.

As shown in FIG. 2, a sensing pixel 210 may include a sensing circuit 212 and a sensing element 214 electrically connected to the sensing circuit 212, and the sensing circuit 212 may be electrically connected to the driving circuit 220 located in the peripheral region R2. The sensing element 214 may be, for example, a photodiode, a phototransistor, a metal-semiconductor-metal photodetector (MSM photodetector) or any suitable photosensitive elements, but not limited herein. The driving circuit 220 may include a plurality of thin film transistors (not shown), and the driving circuit 220 may be used to provide a reset voltage Vrst and a selection voltage Vsel. In order to clearly interpret the present disclosure, the sensing element 214 of this embodiment may be illustrated by taking a photodiode as an example. In some embodiments, as shown in FIG. 2, the sensing pixel 210 may include a plurality of sensing elements 214 electrically connected to the sensing circuit 212, and the sensing circuit 212 may include, for example, a thin film transistor TFT1, a thin film transistor TFT2 and a thin film transistor TFT3. The anode of the sensing element 214 is electrically connected to a working voltage Vcc2, and the cathode of the sensing element 214 is electrically connected to the first electrode of the thin film transistor TFT1 and the gate of the thin film transistor TFT2. The thin film transistor TFT2 may generate signals according to the change of the cathode voltage of the sensing element 214. The thin film transistor TFT2 is electrically connected to the thin film transistor TFT3, and the thin film transistor TFT3 determines whether a signal is output based on the selection voltage Vsel. The thin film transistor TFT1 may be used as a reset element to reset signals. The thin film transistor TFT2 may be used as a source follower element to make the signal of the source follows the signal of the gate. The thin film transistor TFT3 may be used as a selection element to provide signal output. The second electrode of the thin film transistor TFT1 may be electrically connected to a working voltage Vcc1, and the gate of the thin film transistor TFT1 is electrically connected to the reset voltage Vrst. The first electrode of the thin film transistor TFT2 may be electrically connected to a working voltage Vcc0, and the second electrode of the thin film transistor TFT2 is electrically connected to the first electrode of the thin film transistor TFT3. The gate of the thin film transistor TFT3 is electrically connected to the selection voltage Vsel, and the second electrode of the thin film transistor TFT3 may output an output voltage Vout.

As shown in FIG. 3, the optical sensing device SD may include a base layer 100, a circuit layer 200 and a light collimating structure 300. The circuit layer 200 is disposed on the base layer 100, and the light collimating structure 300 is disposed on the circuit layer 200. In some embodiments, the base layer 100 may include a substrate 102 and a buffer layer 104, and the buffer layer 104 is disposed on the substrate 102. The substrate 102 may include hard material and/or flexible material. For example, the substrate 102 may include glass, a quartz substrate, polyimide (PI), polyethylene terephthalate (PET), other suitable materials or combinations of the above materials, but not limited herein. The circuit layer 200 may include a plurality of thin film transistors 230, an insulating layer 240, an electrode layer 242, a sensing element 214, an insulating layer 246, an insulating layer 248, a transparent conductive layer 250, an insulating layer 252, and an insulating layer 254 sequentially disposed along a direction opposite to a top-view direction Y of the optical sensing device SD. The transparent conductive layer 250 may include, for example, indium tin oxide (ITO). The insulating layer 240, the insulating layer 246, the insulating layer 248, the insulating layer 252 and the insulating layer 254 may include, for example, organic material or inorganic material, and the inorganic material may include, for example, silicon oxide compound (SiOx), silicon nitride compound (SiNx), other suitable materials or combinations of the above materials, but not limited herein. The electrode layer 242 may include, for example, metal material. Thin film transistor 230 is used as a switching element or a driving element (e.g., thin film transistor TFT1, thin film transistor TFT2 and thin film transistor TFT3 shown in FIG. 2). The thin film transistor 230 may include a channel layer 231, a gate insulating layer 232, a gate 233, a first electrode 234 (e.g., a source), a second electrode 235 (e.g., a drain)

and a dielectric layer 236, but not limited herein. The stacking structure of layers of the thin film transistor 230 shown in FIG. 3 is simply one type of example.

As shown in FIG. 1 and FIG. 3, the light collimating structure 300 of the optical sensing device SD may include a light shielding layer 310 (or referred to as a first light shielding layer). The light shielding layer 310 includes at least one first opening 312 corresponding to the sensing element 214, and the light shielding layer 310 is overlapped with the driving circuit 220 in the top-view direction Y of the optical sensing device SD. Through the design of this light shielding layer 310, the function of light collimation may be provided for the sensing element 214, or the influence of light on the driving circuit 220 may be reduced, thereby reducing the influence of stray light or ambient light, so as to improve the signal-to-noise ratio of the sensing pixel 210. In some embodiments, the light shielding layer 310 may include organic material. For example, the light shielding layer 310 may include light absorbing material such as black photoresist material. The disposing of the light shielding layer 310 may improve the signal-to-noise ratio of optical signals, or may reduce the generation of stray capacitance between the light shielding layer 310 and the transparent conductive layer 250, thereby increasing the sensitivity of the sensing element 214.

In some embodiments, as shown in FIG. 3, the light collimating structure 300 of the optical sensing device SD may include a light shielding layer 310 (or referred to as a first light shielding layer), an insulating layer 315, a light shielding layer 320 (or referred to as a second light shielding layer), an insulating layer 325, a light shielding layer 330 (or referred to as a third light shielding layer) and micro-lens 340 sequentially disposed along the direction opposite to the top-view direction Y. The insulating layer 315 is disposed between the first light shielding layer 310 and the second light shielding layer 320, and the insulating layer 325 is disposed between the second light shielding layer 320 and the third light shielding layer 330. The insulating layer 315 and the insulating layer 325 may include organic material, for example. The first light shielding layer 310 may be disposed between the second light shielding layer 320 and the sensing element 214, and the second light shielding layer 320 includes at least one second opening 322 overlapped with the first opening 312 of the first light shielding layer 310 in the top-view direction Y. The size of the first opening 312 of the first light shielding layer 310 may be less than the size of the second opening 322 of the second light shielding layer 320. For example, the width W1 of the first opening 312 may be less than the width W2 of the second opening 322 in a direction X, wherein the direction X may be substantially perpendicular to the top-view direction Y. The micro-lens 340 may be disposed on the first light shielding layer 310, and the micro-lens 340 is overlapped with the first opening 312 in the top-view direction Y. For example, the first opening 312 may substantially correspond to the center or the thickest portion of a micro-lens 340, but not limited herein. The third light shielding layer 330 may be disposed between the micro-lens 340 and the first light shielding layer 310 and disposed between the micro-lens 340 and the second light shielding layer 320, and the third light shielding layer 330 includes at least one third opening 332 overlapped with the first opening 312 of the first light shielding layer 310 in the top-view direction Y. The size of the first opening 312 of the first light shielding layer 310 may be less than the size of the third opening 332 of the third light shielding layer 330. For example, the width W1 of the first opening 312 may be less than the width W3 of the third opening 332 in the direction X.

In some embodiments, the first light shielding layer 310, the second light shielding layer 320 and the third light shielding layer 330 may include organic material, such as black photoresist material. Therefore, when the first light shielding layer 310 is disposed between the insulating layer 254 and the insulating layer 315, the second light shielding layer 320 is disposed between the insulating layers 315 and the insulating layer 325, and/or the third light shielding layer 330 is disposed between the insulating layers 325 and the micro-lens 340, they have good adhesion therebetween. No protective layer is required to be additionally disposed between one and another of these layers for improving adhesion, so that the influence of the protective layer on light transmission may be reduced. In addition, the first light shielding layer 310, the insulating layer 315, the second light shielding layer 320, the insulating layer 325, the third light shielding layer 330 and the micro-lens 340 may be respectively formed by a photolithography process, so that the complexity of the manufacturing process may be reduced.

Figure 4:
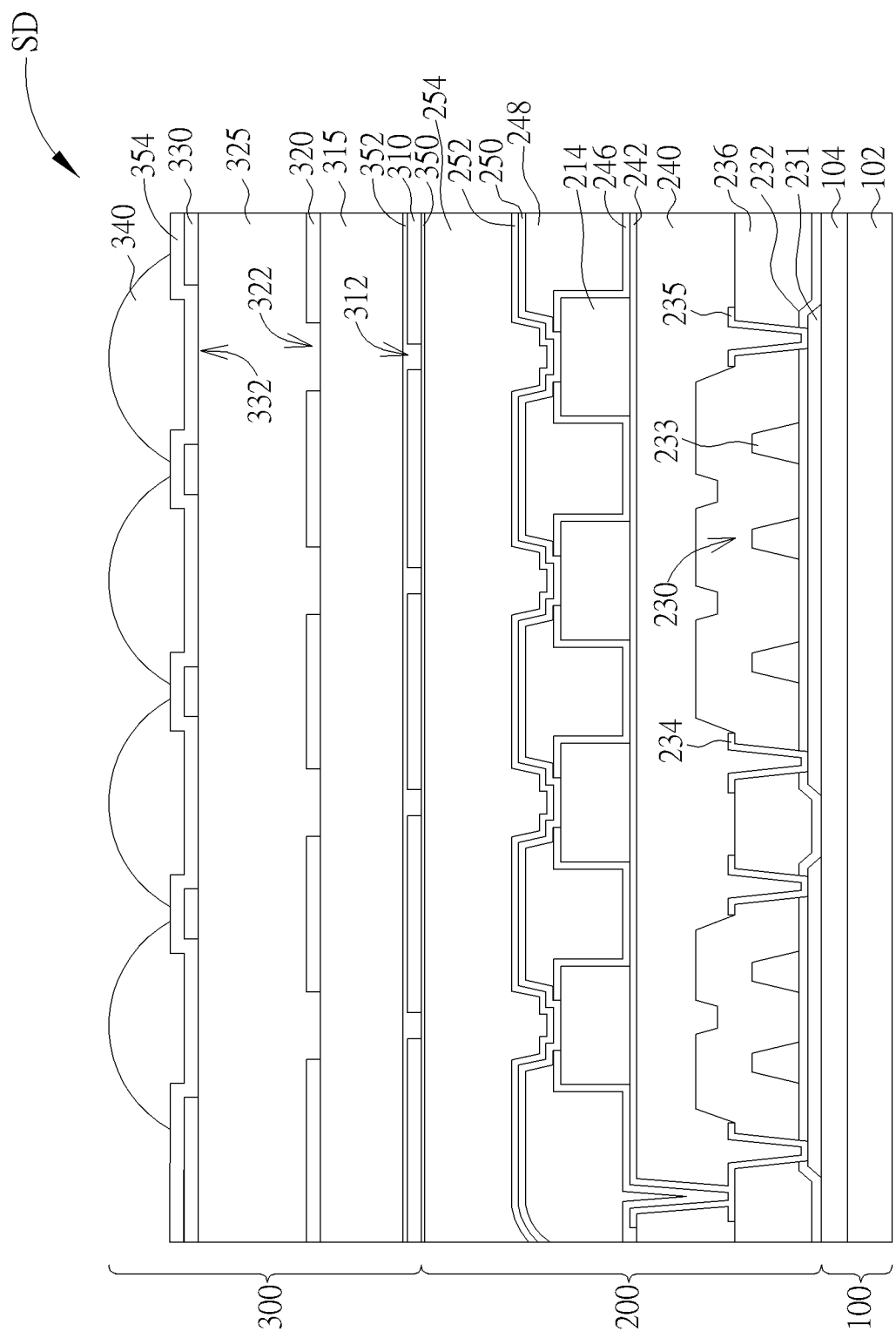
FIG. 4 is a partial cross-sectional view schematic diagram of an optical sensing device according to a second embodiment of the present disclosure.

Please refer to FIG. 4. FIG. 4 is a partial cross-sectional view schematic diagram of an optical sensing device according to a second embodiment of the present disclosure. In some embodiments, as shown in FIG. 4, the light collimating structure 300 of the optical sensing device SD may include a light shielding layer 310, an insulating layer 315, a light shielding layer 320, an insulating layer 325, a light shielding layer 330 and a micro-lens 340. The light shielding layer 310 may be disposed between the light shielding layer 320 and the sensing element 214. Furthermore, the light shielding layer 320 includes organic material such as black photoresist material, and the light shielding layer 310 includes metal material. Since the light shielding layer 310 includes metal material, the light shielding layer 310 with smaller openings 312 can be manufactured to improve the signal-to-noise ratio of optical signals. The light shielding layer 330 may be disposed between the micro-lens 340 and the light shielding layer 320, and the light shielding layer 330 includes organic material. The insulating layer 315, the light shielding layer 320, the insulating layer 325, the light shielding layer 330 and the micro-lens 340 are respectively formed by a photolithography process, so that the complexity of the manufacturing process may be reduced. In some embodiments, the light collimating structure 300 may further include a protective layer 350 and/or a protective layer 352. The protective layer 350 may be disposed between the light shielding layer 310 and the insulating layer 254, and the protective layer 352 may be disposed between the light shielding layer 310 and the insulating layer 315, so as to improve the adhesion between the light shielding layer 310 and the insulating layer 254 or the adhesion between the light shielding layer 310 and the insulating layer 315, and increase the reliability of the optical sensing device SD. The protective layer 350 and the protective layer 352 may include silicon nitride compound (SiNx), silicon oxide compound (SiOx), other suitable materials or combinations of the above materials, but not limited herein. In some embodiments, the protective layer 352 may be replaced by an anti-reflection layer and disposed on the light shielding layer 310. The anti-reflection layer may be a multilayer composite structure constituted by high refractive index layer(s) and low refractive index layer(s), but not limited herein. In some embodiments, the light collimating structure 300 may further include a protective layer 354 disposed between the light shielding layer 330 and the micro-lens 340 to improve the adhesion between the light shielding layer 330 and the micro-lens 340 and increase the reliability of the optical sensing device SD. The protective layer 354 may include silicon nitride compound (SiNx), silicon oxide compound (SiOx), other suitable materials or combinations of the above materials, but not limited herein.

Figure 5:
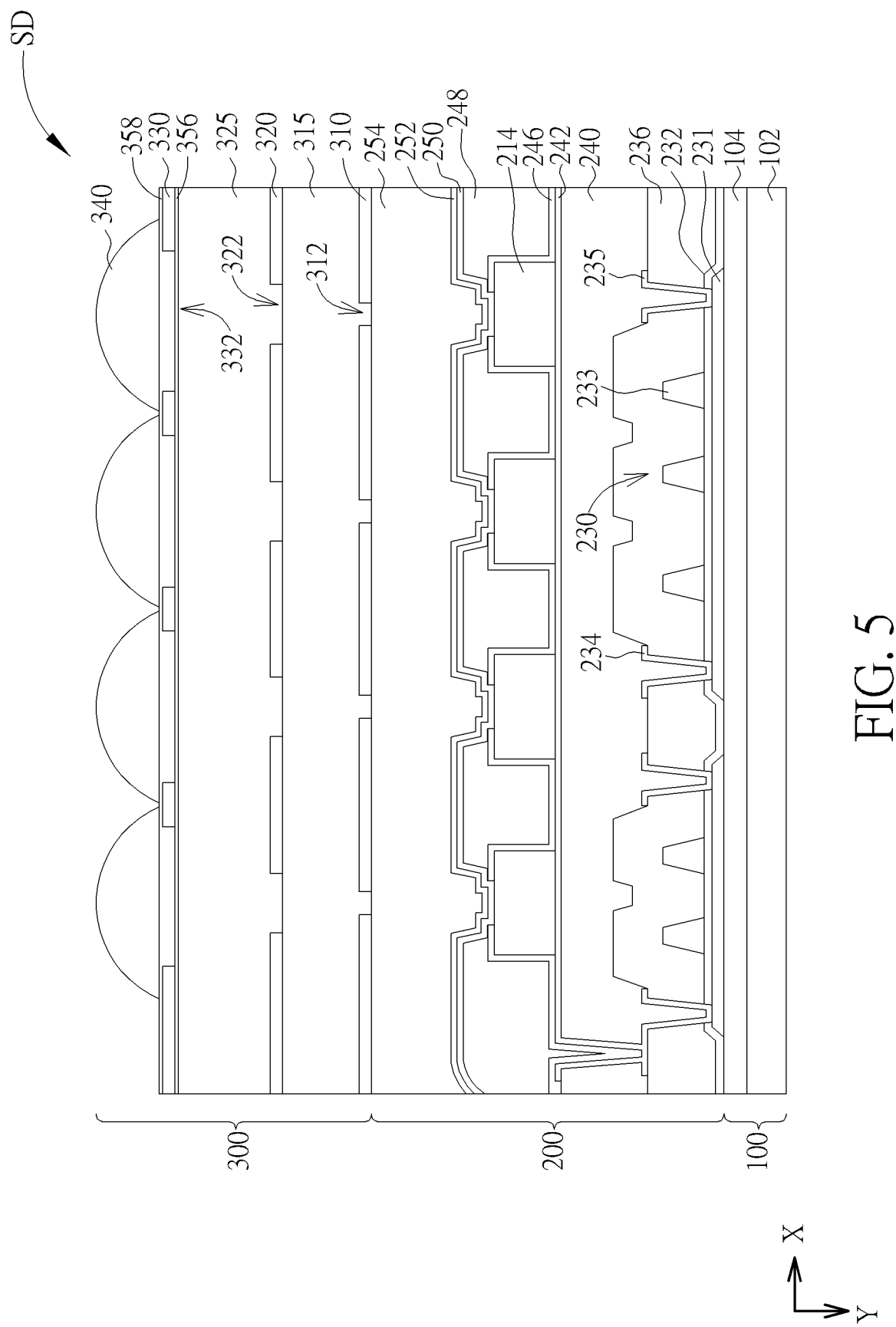
FIG. 5 is a partial cross-sectional view schematic diagram of an optical sensing device according to a third embodiment of the present disclosure.

Please refer to FIG. 5. FIG. 5 is a partial cross-sectional view schematic diagram of an optical sensing device according to a third embodiment of the present disclosure. In some embodiments, as shown in FIG. 5, the light collimating structure 300 of the optical sensing device SD may include a light shielding layer 310, an insulating layer 315, a light shielding layer 320, an insulating layer 325, a light shielding layer 330 and a micro-lens 340. The light shielding layer 310 may be disposed between the light shielding layer 320 and the sensing element 214, and the light shielding layer 310 and the light shielding layer 320 includes organic material such as black photoresist material. The light shielding layer 330 may be disposed between the light shielding layer 320 and the micro-lens 340, and the light shielding layer 330 includes metal material. Since the light shielding layer 330 includes metal material, it may have a thinner thickness than a layer including organic material, so that the surface level difference of the light shielding layer 330 can be reduced, thereby easy to control the subsequent process of the micro-lens 340. The light shielding layer 310, the insulating layer 315, the light shielding layer 320 and the insulating layer 325 may be respectively formed by a photolithography process, so that the complexity of the manufacturing process may be reduced. In some embodiments, the light collimating structure 300 may further include a protective layer 356 and/or a protective layer 358. The protective layer 356 may be disposed between the light shielding layer 330 and the insulating layer 325, and the protective layer 358 may be disposed between the light shielding layer 330 and the micro-lens 340, so as to improve the adhesion between the light shielding layer 330 and the insulating layer 325 or the micro-lens 340, thereby increasing the reliability of the optical sensing device SD. The protective layer 356 and the protective layer 358 may include silicon nitride compounds (SiNx), silicon oxide compounds (SiOx), other suitable materials or combinations of the above materials, but not limited herein.

Figure 6:
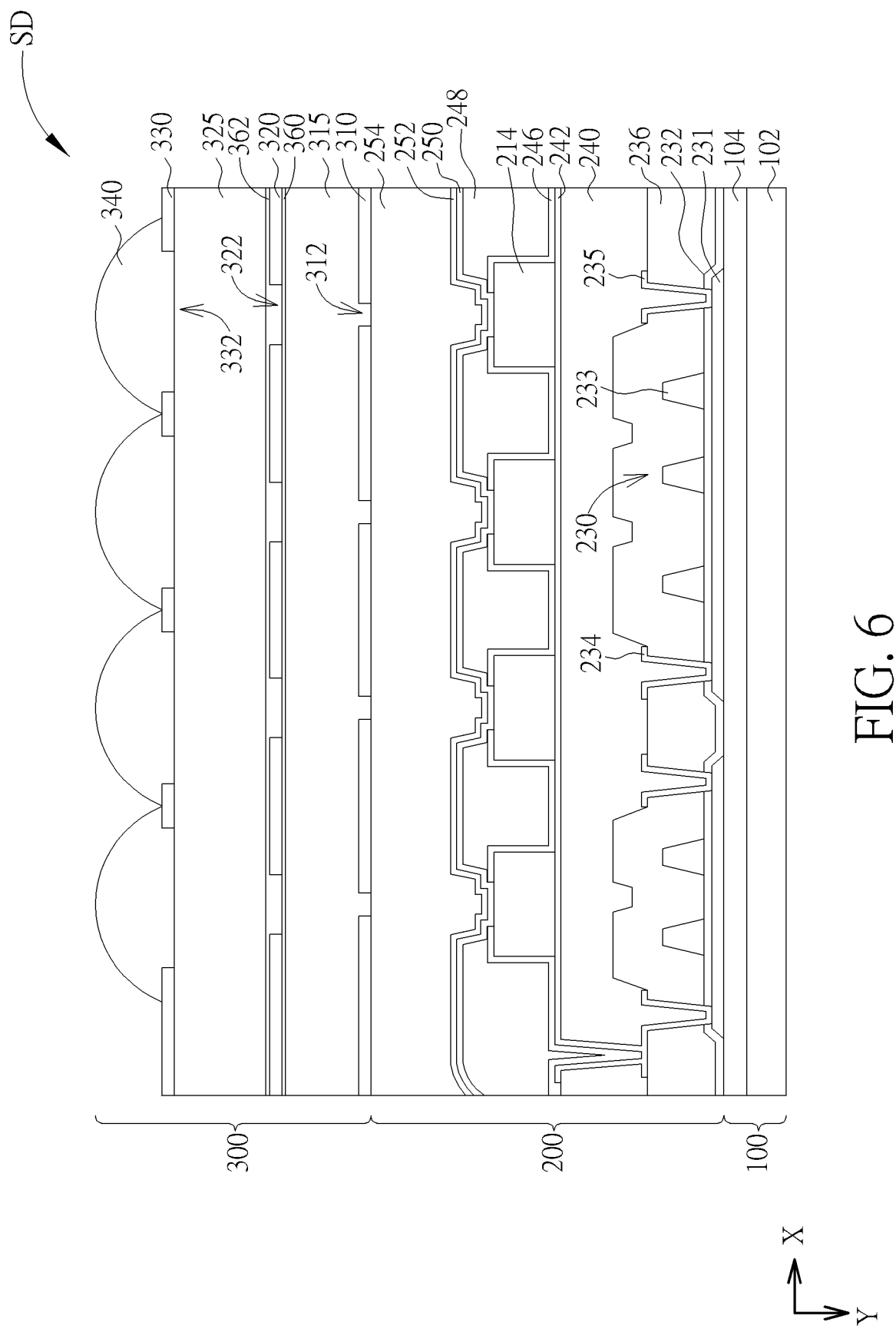
FIG. 6 is a partial cross-sectional view schematic diagram of an optical sensing device according to a fourth embodiment of the present disclosure.

Please refer to FIG. 6. FIG. 6 is a partial cross-sectional view schematic diagram of an optical sensing device according to a fourth embodiment of the present disclosure. In some embodiments, as shown in FIG. 6, the light collimating structure 300 of the optical sensing device SD may include a light shielding layer 310, an insulating layer 315, a light shielding layer 320, an insulating layer 325, a light shielding layer 330 and a micro-lens 340. The light shielding layer 310 may be disposed between the light shielding layer 320 and the sensing element 214. Furthermore, the light shielding layer 310 includes organic material such as black photoresist material, and the light shielding layer 320 includes metal material. The light shielding layer 330 may be disposed between the light shielding layer 320 and the micro-lens 340, and the light shielding layer 330 includes organic material. Since the light shielding layer 320 includes metal material, it is beneficial to make the alignment between the light shielding layer 310 and the light shielding layer 320 more accurate in the manufacturing process. The light shielding layer 310, the insulating layer 315, the insulating layer 325, the light shielding layer 330 and the micro-lens 340 are respectively formed by a photolithography process, so that the complexity of the manufacturing process may be reduced. In some embodiments, the light collimating structure 300 may further include a protective layer 360 and/or a protective layer 362. The protective layer 360 may be disposed between the light shielding layer 320 and the insulating layer 315, and the protective layer 362 may be disposed between the light shielding layer 320 and the insulating layer 325, so as to improve the adhesion between the light shielding layer 320 and the insulating layer 315 or the adhesion between the light shielding layer 320 and the insulating layer 325, and increase the reliability of the optical sensing device SD. The protective layer 360 and the protective layer 362 may include silicon nitride compound (SiNx), silicon oxide compound (SiOx), other suitable materials or combinations of the above materials, but not limited herein.

Figure 7:
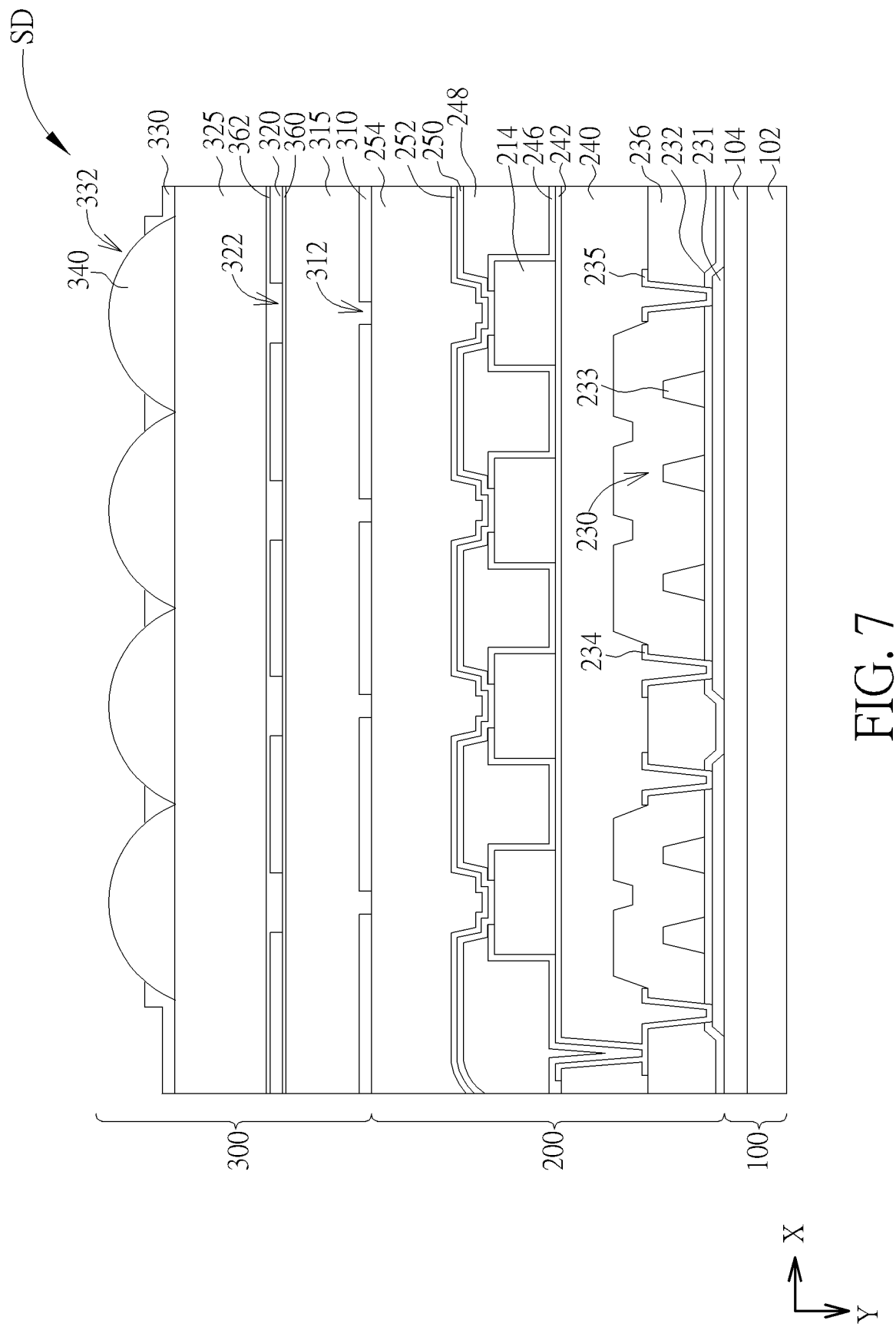
FIG. 7 is a partial cross-sectional view schematic diagram of an optical sensing device according to a variation embodiment of the fourth embodiment of the present disclosure.

Please refer to FIG. 7. FIG. 7 is a partial cross-sectional view schematic diagram of an optical sensing device according to a variation embodiment of the fourth embodiment of the present disclosure. In some embodiments, as shown in FIG. 7, the light collimating structure 300 of the optical sensing device SD may include a light shielding layer 310, an insulating layer 315, a light shielding layer 320, an insulating layer 325, a light shielding layer 330 and a micro-lens 340. The light shielding layer 310 may be disposed between the light shielding layer 320 and the sensing element 214. Furthermore, the light shielding layer 310 includes organic material such as black photoresist material, and the light shielding layer 320 includes metal material. The light shielding layer 330 may be disposed on the micro-lens 340, and the light shielding layer 330 includes at least one opening 332 overlapped with the opening 312 of the light shielding layer 310 in the top-view direction Y. The opening 332 may accommodate the micro-lens 340. The light shielding layer 330 may include organic material. The light collimating structure 300 may further include a protective layer 360 and/or a protective layer 362. The protective layer 360 may be disposed between the light shielding layer 320 and the insulating layer 315, and the protective layer 362 may be disposed between the light shielding layer 320 and the insulating layer 325. The protective layer 360 and the protective layer 362 may include silicon nitride compound (SiNx), silicon oxide compound (SiOx), other suitable materials or combinations of the above materials, but not limited herein. In this embodiment, the micro-lens 340 is disposed on the insulating layer 325 firstly, and then the light shielding layer 330 is disposed on the micro-lens 340, so that the micro-lens 340 may be disposed on a flat surface, which reduces the difficulty of the manufacturing process.

Figure 8:
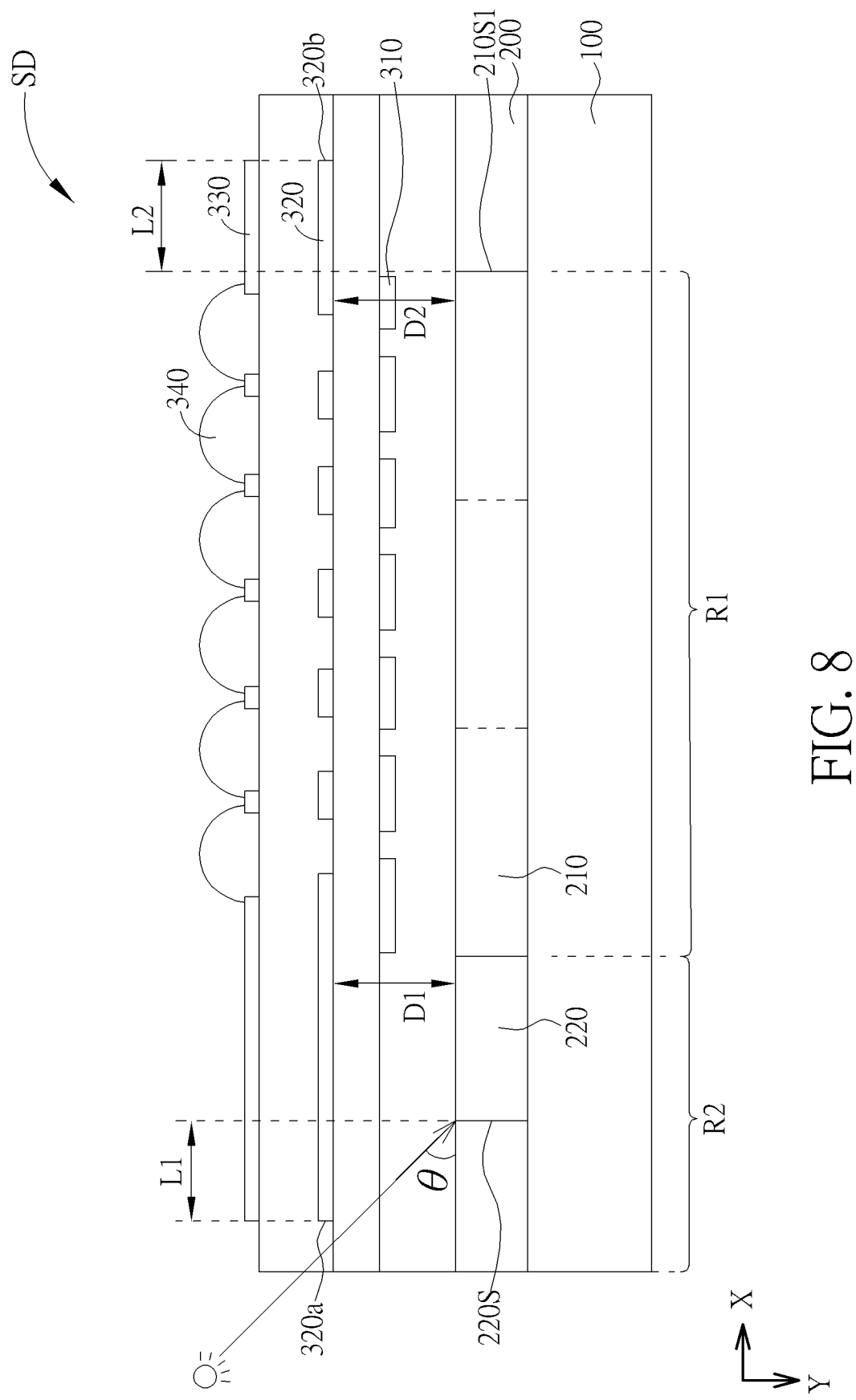
FIG. 8 is a partial cross-sectional view schematic diagram of an optical sensing device according to an embodiment of the present disclosure.

Please refer to FIG. 8, FIG. 1 and FIG. 2. FIG. 8 is a partial cross-sectional view schematic diagram of an optical sensing device according to an embodiment of the present disclosure. In some embodiments, as shown in FIG. 8, FIG. 1 and FIG. 2, at least one of the light shielding layer 310, the light shielding layer 320 and the light shielding layer 330 of the optical sensing device SD may extend outward from a side 220S of the driving circuit 220 by a specific distance. In detail, when an ambient light (e.g., sunlight) incident on the optical sensing device SD, an angle θ exists between the ambient light and the direction X, wherein the direction X may be substantially perpendicular to the top-view direction Y of the optical sensing device SD. An edge 320a of the light shielding layer 320 adjacent to the side 220S of the driving circuit 220 may extend outward from the driving circuit 220 by a first extension distance L1, a vertical distance between the light shielding layer 320 and the driving circuit 220 in the top-view direction Y is defined as a first spacing D1, and the first extension distance L1 multiplied by tan θ is greater than or equal to the first spacing D1 (i.e., L1*tan θ≥D1). Therefore, the ambient light may have less influence on the sensing device SD when sensing optical signals. For example, the first extension distance L1 may be greater than or equal to the first spacing D1 when the angle θ of the incident light is 45 degrees (i.e., tan 45°=1, and L1≥D1). The first spacing D1 may be measured from the upper surface of the thin film transistor in the driving circuit 220 to the lower surface of the light shielding layer 320, for example. In some embodiments, at least one of the light shielding layer 310, the light shielding layer 320 and the light shielding layer 330 of the optical sensing device SD may extend outward from a side 2105l (or a side 2105l2) of the sensing pixel 210 by a distance. For example, an edge 320b of the light shielding layer 320 adjacent to the side 2105l of the sensing pixel 210 may extend outward from the sensing pixel 210 by a second extension distance L2, a vertical distance between the light shielding layer 320 and the sensing element 214 of the sensing pixel 210 in the top-view direction Y is defined as a second spacing D2, and the second extension distance L2 multiplied by tan θ is greater than or equal to the second spacing D2 (i.e., L2*tan θ≥D2). Therefore, the ambient light may have less influence on the sensing device SD when sensing optical signals. For example, the second extension distance L2 may be greater than or equal to the second spacing D2 when the angle θ of the incident light is 45 degrees (i.e., tan 45°=1, and L2>D2). The second spacing D2 may be measured from the upper surface of the sensing element (not shown in FIG. 8) to the lower surface of the light shielding layer 320, for example.

From the above description, according to the optical sensing devices of the embodiments of the present disclosure, through the design of the light shielding layer, the influence of stray light or ambient light can be reduced, thereby improving the signal-to-noise ratio of optical signals. Based on the present disclosure, the complexity of the manufacturing process can be reduced. In another aspect, the adhesion between layers can be improved. Furthermore, the light shielding layer may include organic material, so as to reduce the generation of stray capacitance between the light shielding layer and the conductive layer, thereby increasing the sensitivity of the sensing element. In addition, the light shielding layer may include metal material, so that the light shielding layer with smaller openings may be manufactured, or the light shielding layer may have a thinner thickness, so as to facilitate the subsequent process.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. An optical sensing device, comprising:
a sensing pixel comprising a sensing circuit and a sensing element electrically connected to the sensing circuit;
a driving circuit electrically connected to the sensing circuit;
a first light shielding layer comprising at least one first opening corresponding to the sensing element;
a second light shielding layer comprising at least one second opening overlapped with the at least one first opening in a top-view direction of the optical sensing device, wherein the second light shielding layer is overlapped with the driving circuit in the top-view direction; and
a third light shielding layer comprising at least one third opening overlapped with the at least one first opening in the top-view direction,
wherein an edge of the second light shielding layer corresponds to a peripheral region of the optical sensing device, and a horizontal distance between the edge of the second light shielding layer and the sensing pixel is greater than a horizontal distance between the edge of the second light shielding layer and the driving circuit,
wherein the second light shielding layer is overlapped with the third light shielding layer in the peripheral region, and a boundary between the peripheral region and a sensing region of the optical sensing device is at an outer side of an edge of the first light shielding layer,
wherein another edge of the second light shielding layer adjacent to the sensing pixel extends outward from the sensing pixel by a second extension distance, a vertical distance between the second light shielding layer and the sensing pixel in the top-view direction is defined as a second spacing, and the second extension distance is greater than or equal to the second spacing.

2. The optical sensing device according to claim 1, wherein the first light shielding layer comprises organic material.

3. The optical sensing device according to claim 1, wherein the first light shielding layer comprises organic material, and the second light shielding layer comprises metal material.

4. The optical sensing device according to claim 1, wherein the second light shielding layer is disposed between the first light shielding layer and the sensing element.

5. The optical sensing device according to claim 4, further comprising an anti-reflection layer disposed on the second light shielding layer.

6. The optical sensing device according to claim 1, wherein the first light shielding layer is disposed between the second light shielding layer and the sensing element.

7. The optical sensing device according to claim 6, wherein a size of the at least one first opening of the first light shielding layer is less than a size of the at least one second opening of the second light shielding layer.

8. The optical sensing device according to claim 1, further comprising an insulating layer disposed between the first light shielding layer and the second light shielding layer.

9. The optical sensing device according to claim 8, further comprising a protective layer disposed between the first light shielding layer and the insulating layer or disposed between the second light shielding layer and the insulating layer.

10. The optical sensing device according to claim 1, further comprising a micro-lens disposed on the first light shielding layer, wherein the micro-lens is overlapped with the at least one first opening in the top-view direction.

11. The optical sensing device according to claim 10, wherein the third light shielding layer is disposed between the micro-lens and the first light shielding layer.

12. The optical sensing device according to claim 11, wherein a size of the at least one first opening of the first light shielding layer is less than a size of the at least one third opening of the third light shielding layer.

13. The optical sensing device according to claim 11, further comprising a protective layer disposed between the third light shielding layer and the micro-lens.

14. The optical sensing device according to claim 11, wherein the first light shielding layer comprises organic material, and the third light shielding layer comprises metal material.

15. The optical sensing device according to claim 11, further comprising an insulating layer disposed between the first light shielding layer and the third light shielding layer.

16. The optical sensing device according to claim 15, further comprising a protective layer disposed between the first light shielding layer and the insulating layer or disposed between the third light shielding layer and the insulating layer.

17. The optical sensing device according to claim 10, wherein the third light shielding layer is disposed on the micro-lens.

18. The optical sensing device according to claim 1, wherein the edge of the second light shielding layer adjacent to the driving circuit extends outward from the driving circuit by a first extension distance, a vertical distance between the second light shielding layer and the driving circuit in the top-view direction is defined as a first spacing, and the first extension distance is greater than or equal to the first spacing.

* * * * *